United States Patent
Pasolini et al.

(10) Patent No.: US 6,492,926 B2
(45) Date of Patent: Dec. 10, 2002

(54) NOISE COMPENSATION DEVICE AND METHOD IN A DISCRETE TIME CONTROL SYSTEM

(75) Inventors: Fabio Pasolini, San Martino Siccomario (IT); Ernesto Lasalandra, San Donato Milanese (IT); Paolo Bendiscioli, Pavia (IT); Charles G. Hernden, Boulder, CO (US)

(73) Assignees: STMicroelectronics S.r.l., Agrate Brianza (IT); STMicroelectronics Inc., Carrollton, TX (US)

( * ) Notice: Subject to any disclaimer, the term of this patent is extended or adjusted under 35 U.S.C. 154(b) by 0 days.

(21) Appl. No.: 09/988,990

(22) Filed: Nov. 19, 2001

(65) Prior Publication Data

US 2002/0089439 A1 Jul. 11, 2002

Related U.S. Application Data

(60) Provisional application No. 60/252,936, filed on Nov. 24, 2000.

(51) Int. Cl.[7] .............................................. H03M 3/00
(52) U.S. Cl. ....................................................... 341/143
(58) Field of Search ................................ 341/143, 122, 341/155, 144, 123; 375/41; 702/74

(56) References Cited

U.S. PATENT DOCUMENTS

| | | | |
|---|---|---|---|
| 4,472,785 A | 9/1984 | Kasuga | 364/718 |
| 4,746,899 A | 5/1988 | Swanson et al. | 340/347 AD |
| 4,942,546 A | * 7/1990 | Rambaut | 702/74 |
| 5,087,829 A | 2/1992 | Ishibashi et al. | 307/269 |
| 5,767,720 A | 6/1998 | Osera et al. | 327/295 |
| 5,995,536 A | * 11/1999 | Arkhipkin | 375/41 |
| 6,057,791 A | 5/2000 | Knapp | 341/122 |

FOREIGN PATENT DOCUMENTS

| | | |
|---|---|---|
| EP | 0384595 A2 | 8/1990 |
| EP | 0419823 A1 | 4/1991 |
| EP | 0602718 A2 | 6/1994 |
| EP | 0798698 A2 | 10/1997 |
| WO | WO 00/43993 | 7/2000 |

OTHER PUBLICATIONS

Abramovitch, D.Y., "Rejecting Rotational Disturbances on Small Disk Drives Using Rotational Accelerometers", *Control Eng. Practice*, vol. 5, No. 11, Nov. 1997, pp. 1517–1524.

Jinzenji, Akihide, et al., "Acceleration Feedforward Control against Rotational Disturbance in Hard Disk Drives", *IEEE*, Mar. 2000, pp. TA6–01–TA6–02.

Lemkin, M., et al., "A Three–Axis Micromachined Accelerometer with a CMOS Postion–Sense Interface and Digital Offset–Trim Electronics", *IEEE*, vol. 34, No. 4, Apr. 1999, pp. 456–468.

* cited by examiner

*Primary Examiner*—Brian Young
(74) *Attorney, Agent, or Firm*—Lisa K. Jorgenson; Robert Iannucci; Seed IP Law Group PLLC

(57) ABSTRACT

A noise compensating device in a discrete time control system, such as a R/W system for hard disks, including: a control loop generating a first timing signal, a signal indicative of a quantity to be controlled, and a control signal, which have a first frequency; and an open loop control line which generates a compensation signal synchronous with the control signal and includes a sensor. The sensor includes a sensing element, generating an analog signal, an acquisition stage, connected to the sensing element and generating a disturbance measure signal correlated to the analog signal and synchronous with the control signal, and a synchronization stage. The synchronization stage includes a frequency generator having an input receiving the first timing signal and a first and a second output connected to the acquisition stage and generating, respectively, a second timing signal and a third timing signal.

24 Claims, 3 Drawing Sheets

NOISE COMPENSATION DEVICE AND METHOD IN A DISCRETE TIME CONTROL SYSTEM

TECHNICAL FIELD

The present invention refers to a noise compensation device and method in a discrete time control system.

BACKGROUND OF THE INVENTION

It is known that high precision control devices frequently have, in addition to a feedback control system, closed loop systems for compensating external noise. These compensation systems use sensors detecting the presence of external noise and generating compensation signals that are added to the control signals used in the feedback loop.

In particular, discrete time control systems are required to synchronize the control signals and the compensation signals so that they may be correctly added.

An application of this compensation technique, to which reference will be made hereinafter, are hard disk read/write devices for controlling the position of reading heads.

As is known, R/W devices, referred to as hard disk drives (HDDs), normally comprise a set of magnetic disks, rotating all together, a head-actuator assembly, and an electronic control unit. The head-actuator assembly comprises a plurality of arms turning about a same rotation axis, integral with one another and actuated by a motor, and reading heads, each reading head being carried by a respective arm and facing respective surfaces of the disks.

Control information is stored in preset control sectors on the disks, is picked up by the heads and enables detection of the position of the heads with respect to the tracks on the magnetic disks. In particular, the heads generate an analog signal that is sampled at a preset rate (depending upon the rotation rate of the disk) to generate a numeric position signal. The electronic control unit detects a position error on the basis of the numeric position signal and generates a numeric control signal for controlling the head-actuator assembly and keeping the heads in optimal reading positions.

In addition, the control system comprises an open loop compensation line for compensating the effects of external disturbance. In particular, an acceleration sensor (for example, a sensor made using MicroElectroMechanicalSystem—MEMS—technology), mounted so as to be integral with the casing of the R/W device, detects any disturbance mechanical vibration and supplies an acceleration signal which is, in turn, sampled at a compensation rate and used by the electronic control unit to generate a numeric compensation signal to be added to the control signal.

The data supplied by the sensor and the control signal are not, however, synchronous, and thus cannot be immediately summed. To overcome this problem, synchronization techniques normally used carry out a sampling rate conversion.

In practice, the sequence of data supplied by the sensor is initially expanded by interposing, between two consecutive samples, a first preset integer number L of null samples corresponding to instants comprised within a same sampling interval. The expanded sequence of data is then filtered using a low pass filter to replace the null samples with interpolated samples. Next, a decimator reduces the expanded sequence of data, maintaining one sample every M samples (where M is a second preset integer number) and eliminating all the others. By selecting the numbers L and M so that the condition $$F_c = \frac{L+1}{M} F_s$$

is satisfied, wherein $F_C$ is the control sampling rate and $F_S$ is the sensor sampling rate, the sequence of data at the output of the decimator is synchronous with the control signal and can thus be used to generate the compensation signal.

Known devices, however, have a number of drawbacks. In fact, performing frequency conversions increases the phase delay of the compensation signal with respect to the control signal. This is particularly disadvantageous because, as is known to those skilled in the art, the phase delay is a critical parameter for the effectiveness of open loop compensation and must therefore be contained as far as possible. In addition, the frequency conversion is carried out by microprograms (firmware) which, on the one hand, require a physical encumbrance as they must be stored in a non-volatile memory and, on the other hand, cause an increase in the required processing power.

A further drawback of known devices results from the high frequency noise (approximately 4–5 kHz) normally introduced during the noise measure and the acceleration signal generation. This high frequency noise must be reduced by filtering which, once again, is carried out by microprograms.

SUMMARY OF THE INVENTION

The present invention is embodied in a system and method for noise compensation in a discrete time control system. In an exemplary embodiment, the device comprises closed loop control means for generating a first timing signal, a signal indicative of the quantity to be controlled, and a control signal, which have a control frequency. The device further includes open loop control means for generating a compensation signal synchronous with the control signal and supplied to the closed loop control for correcting the control signal. The open loop control means comprises a sensing means for generating an analog signal correlated to a disturbance quantity, sampling means for receiving the analog signal and generating a sampled signal having a sample frequency correlated to the control frequency and a decimator stage for receiving the sample signal generating the compensation signal.

In an exemplary application, the noise compensating device may be used in a read/write (R/W) device, such as a disc drive and comprises a rotatable computer-readable media, a R/W head positioned in proximity with the computer-readable media to read data stored on the computer-readable media and write data to the computer-readable media, and an R/W device control circuit. The control circuit comprises a closed loop control circuit and an open loop control circuit. In one embodiment, the R/W device is a hard disc and the signal indicative of the quantity to be controlled is a track position and the disturbance quantity is a disturbance acceleration.

BRIEF DESCRIPTION OF THE DRAWINGS

For a better understanding of the present invention, a preferred embodiment thereof is now described, purely as a non-limiting example, with reference to the attached drawings, wherein.

DETAILED DESCRIPTION OF THE INVENTION

In the embodiment described hereinafter, the invention is applied to a read/write (R/W) device for hard disks, even though the invention may be applied to a generic discrete time control system with open loop noise compensation.

Figure 1:
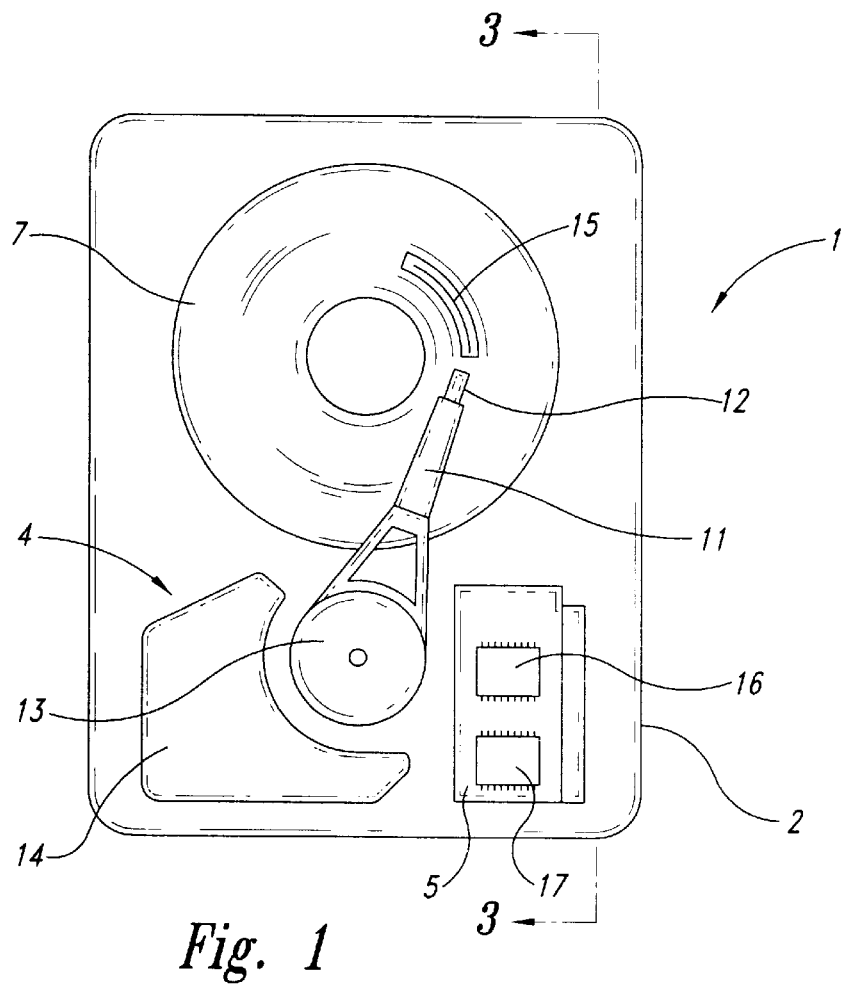
FIG. 1 is a simplified top plan view of a R/W system for a hard disk.
Figure 2:
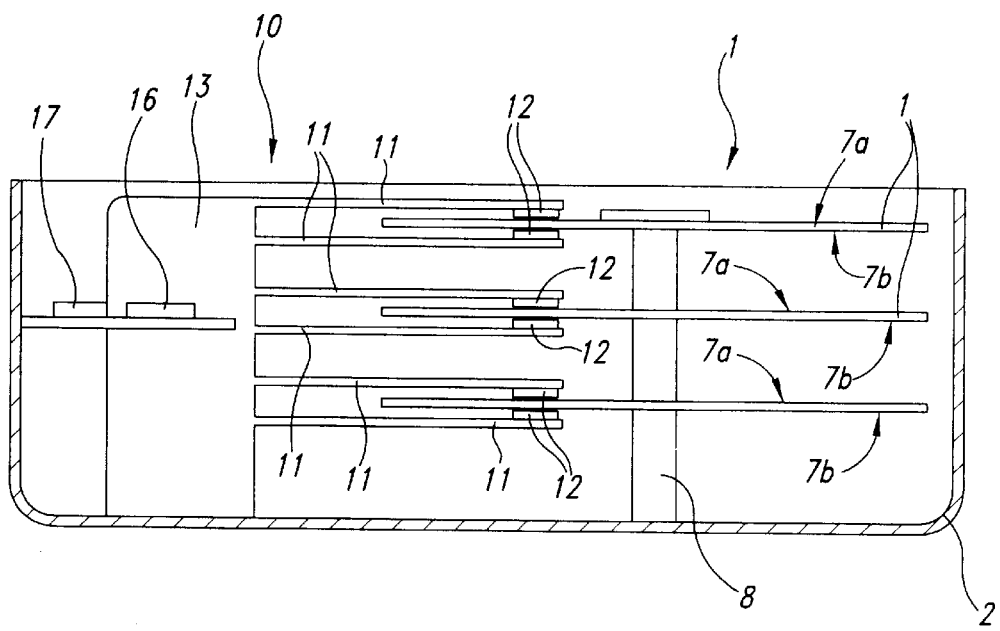
FIG. 2 is a side view of the device of FIG. 1, in a section taken along plane II—II.

With reference to FIGS. 1 and 2, a R/W device 1 for hard disks is housed inside a casing 2 and comprises a plurality of magnetic disks 7, a head-actuator assembly 4, and a control card 5.

The magnetic disks 7 are mounted coaxially and rotationally integral to a shaft 8 of a motor (not shown) and each have a top surface 7a and a bottom surface 7b. In addition, control information is stored, in a per se known manner, in preset sectors of the magnetic disks 7.

The head-actuator assembly 4 comprises a rotating support 13 (generally referred to as an E-block on account of its shape), a plurality of suspension arms 11, integrally connected to the rotating support 13, and a plurality of R/W heads 12 carried by respective suspension arms 11; in use, each R/W head 12 faces a respective surface 7a, 7b of the magnetic disks 7, for reading and writing. A motor 14 is connected to and actuates the rotating support 13 for positioning the R/W heads 12 on a desired data track 15.

The control card 5 is carried by the casing 2 and comprises a control unit 16 and a sensor assembly 17. In addition, the control card 5 is connected to the motor 14 through a connector of a known type (not shown).

Figure 3:
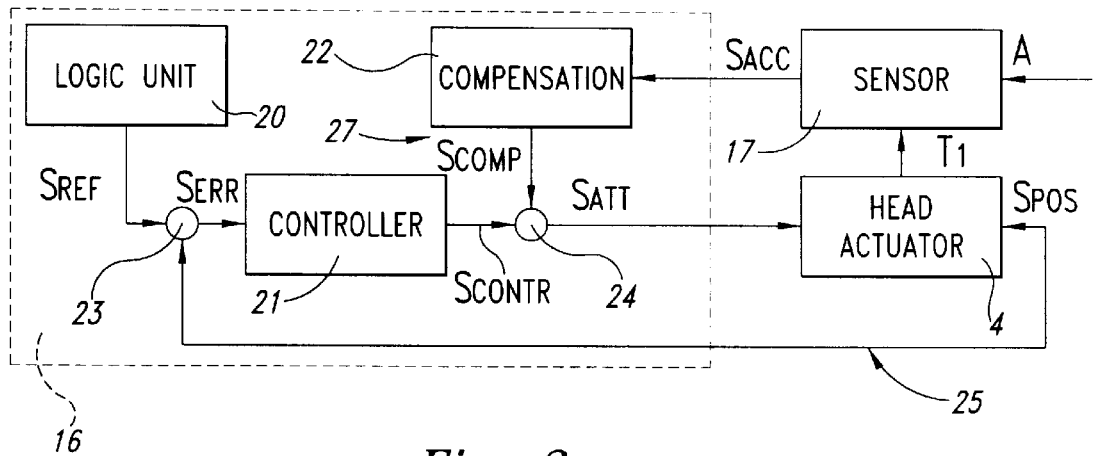
FIG. 3 is a simplified block diagram of a noise compensating device according to the present invention.

As illustrated in FIG. 3, the control unit 16 comprises a logic unit 20, a controller 21, a compensation block 22, a subtracting node 23, and an adding node 24.

The logic unit 20 generates, in a known way, a reference signal $S_{REF}$ indicative of a target position for the R/W heads 12. The subtracting node 23 receives the reference signal $S_{REF}$, as well as a position signal $S_{POS}$ issued on a first output of the head-actuator assembly 4, in a known way. The output of the subtracting node 23 is connected to an input of the controller 21. The controller 21 has an output connected to the adding node 24 and supplying a control signal $S_{CONTR}$. The head-actuator assembly 4 has an input that is connected to the adding node 24 and a second output that is connected to the sensor assembly 17 and supplies a first timing signal $T_1$. The control signal $S_{CONTR}$ and the first timing signal $T_1$ have a first frequency $F_1$ determined by the rotation rate of the disks 7 and by the number of control sectors present. For instance, in a disk having an angular speed of 5400 rpm and 60 control sectors, the first frequency $F_1$ is 5400 Hz.

The sensor assembly 17, which will be described in detail later on with reference to FIG. 4 and is preferably made in a single integrated device, has an output connected to an input of the compensation block 22. In addition, the sensor assembly 17 supplies, on its own output, an acceleration signal $S_{ACC}$ synchronized with the control signal $S_{CONTR}$ and representative of an acceleration A due to noise forces, such as mechanical vibrations, acting on the R/W device 1.

The compensation block 22 has an output connected to the adding node 24 and supplying a compensation signal $S_{COMP}$.

In this way, the sensor assembly 17 and the compensation block 22 form an open loop compensation circuit 27. Furthermore, the controller 21, the head-actuator assembly 4, the subtracting node 23 and adding node 24 form a closed control loop 25.

The position signal $S_{POS}$ supplied by the head-actuator assembly 4 is representative of the distance of the R/W heads 12 from a center-of-track position and is generated when the read heads 12 fly on the sectors of the magnetic disks 7 storing the control information. In particular, the signal $S_{POS}$ is obtained, in a known way, by sampling an analog signal at the first frequency $F_1$. The error signal $S_{ERR}$ and the control signal $S_{CONTR}$ generated within the control loop 25 are synchronous with the position signal $S_{POS}$, and hence have the first frequency $F_1$.

The subtracting node 23 subtracts the position signal $S_{POS}$ from the reference signal $S_{REF}$ and generates an error signal $S_{ERR}$. The error signal $S_{ERR}$ is then used in the controller 21 to obtain the control signal $S_{CONTR}$, using any one of known control techniques (for example, a PID control technique).

The adding node 24 receives the control signal $S_{CONTR}$ and the compensation signal $S_{COMP}$ (which are synchronized with one another) and adds them, to generate an actuation signal $S_{ATT}$ supplied to the head-actuator assembly 4 to correct the position of the read heads 12.

Figure 4:
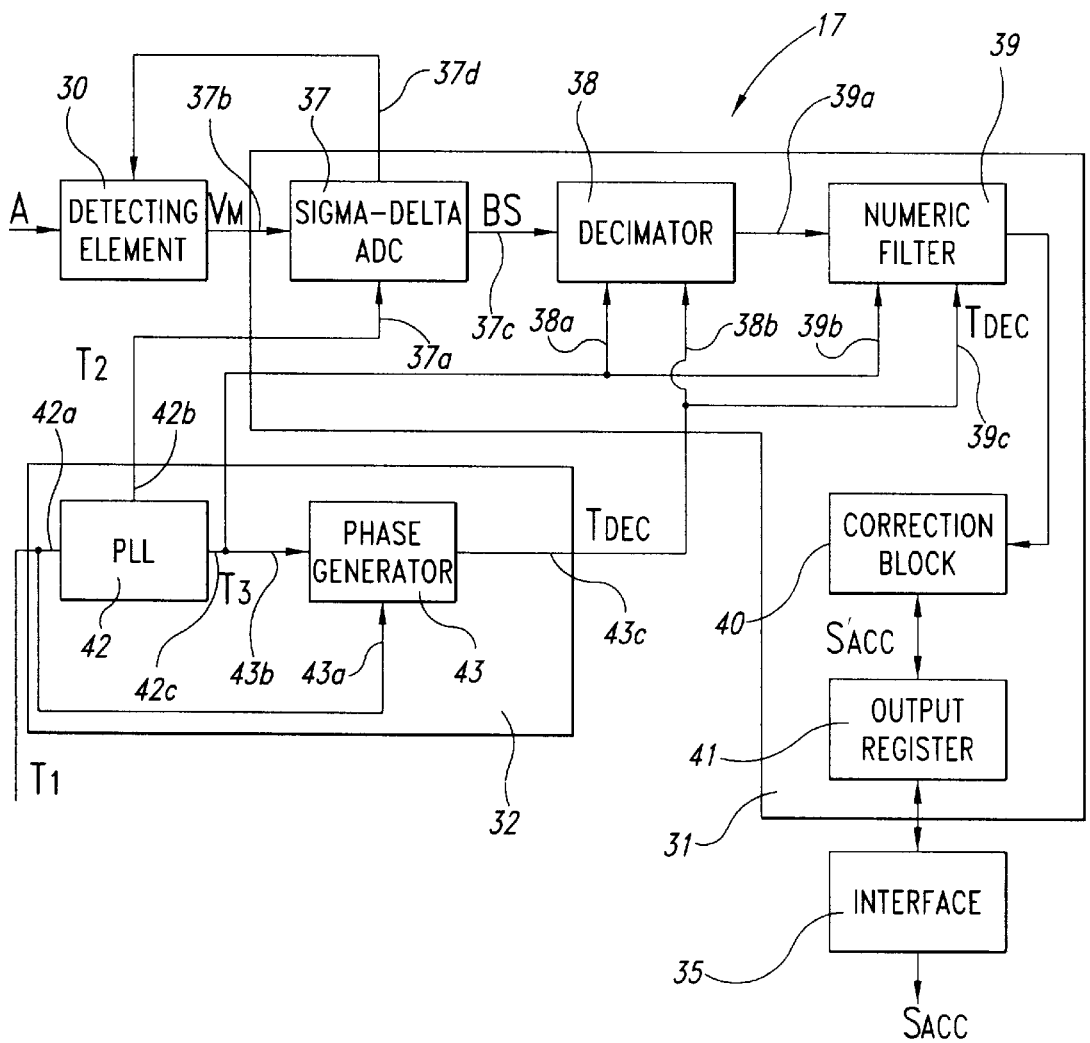
FIG. 4 is a more detailed block diagram of one part of the diagram of FIG. 3.

With reference to FIG. 4, the structure of the sensor assembly 17 is now described, the output signal whereof (acceleration signal $S_{ACC}$) is synchronized with the control signal $S_{CONTR}$.

The sensor assembly 17 comprises a sensing element 30, an acquisition stage 31, a synchronization stage 32, and an interface circuit 35.

The sensing element 30, preferably an acceleration sensor of the rotational type, made using the MEMS technology, detects the rotational component of the acceleration A acting onto the R/W device 1, for example on account of mechanical vibrations, and has an output supplying a measure analog signal $V_M$ correlated to the acceleration A.

The acquisition stage 31 is connected between the sensing element 30 and the interface 35, and comprises an analog-to-digital converter 37, preferably of the sigma-delta type, a decimator 38, a numeric filter 39, a correction block 40, and an output register 41, cascade-connected together. In addition, the A/D converter 37 has a control output 37d connected to a control input of the sensing element 30. Thereby, the sensing element 30 and the A/D converter 37 form an acquisition loop of the sigma-delta type, in itself known and described, for example, in M. Lemkin and B. Boser, "A Three Axis Micromachined Accelerometer with a CMOS Position-Sense Interface and Digital Offset-Trim Electronics", IEEE Journal of Solid State Circuits, Vol. 34, No. 4.

The synchronization stage 32 comprises a phase locked loop (PLL) 42 and a phase generator circuit 43. The PLL 42 has an input 42a receiving the first timing signal $T_1$, a first output 42b connected to a first input 37a of the A/D converter 37 and supplying a second timing signal $T_2$, and a second output 42c connected to a timing input 38a of the decimator 38 and to a timing input 39b of the numeric filter 39 and supplying a third timing signal $T_3$. In the PLL 42, the second timing signal $T_2$ and the third timing signal $T_3$ are generated as described below, starting from the first timing signal $T_1$.

The phase generator circuit 43 has inputs 43a and 43b receiving the first timing signal $T_1$ and, respectively, the third timing signal $T_3$, and an output 43c connected to a decimation input 38b of the decimator 38 and to an activation input 39c of the numeric filter 39. The output 43c of the phase generator circuit 43 supplies decimation pulses $T_{DEC}$ at the first frequency $F_1$ and with a preset delay with respect to the first timing signal $T_1$.

The second timing signal $T_2$ has a second frequency $F_2$ not lower than the first frequency $F_1$, and the third timing signal $T_3$ has a third frequency $F_3$ comprised between the second frequency $F_2$ and the first frequency $F_1$. In particular, the following relationship apply: $F_2=M*F_1$, and $F_3=N*F_1$, where M and N are two integers, with $M \geq N$ (for example, M=224 and N=32). Consequently, since $F_2=(M/N)*F_3$, the second frequency $F_2$ is greater than or equal to the third frequency $F_3$. In addition, the decimation pulses $T_{DEC}$ have the first frequency $F_1$ of the control signal $S_{CONTR}$.

During operation of the R/W device 1, the PLL 42 locks to the first timing signal $T_1$ of the control loop 25 and generates the second timing signal $T_2$ and the third timing signal $T_3$. In turn, the phase generator circuit 43 generates decimation pulses $T_{DEC}$ with a preset delay K with respect to the edges of the first timing signal $T_1$. The delay K is representative of the sample to be selected by the decimator 38. Those skilled in the art will appreciate that the decimator 38 selects a predetermined number of subsamples, but is not limited the selection of every tenth sample.

The A/D converter 37, preferably of the sigma-delta type, receives, on a second input 37b, the analog measure signal $V_M$ and, using the second timing signal $T_2$ as internal timing signal, issues, on an output 37c, a sampled signal BS formed by a flow of bits oversampled with respect to the first frequency $F_1$. In particular, since the A/D converter 37 is of the sigma-delta type, the individual bits of the sampled signal BS are produced by the A/D converter 37 at the third frequency $F_3$.

Figure 5:
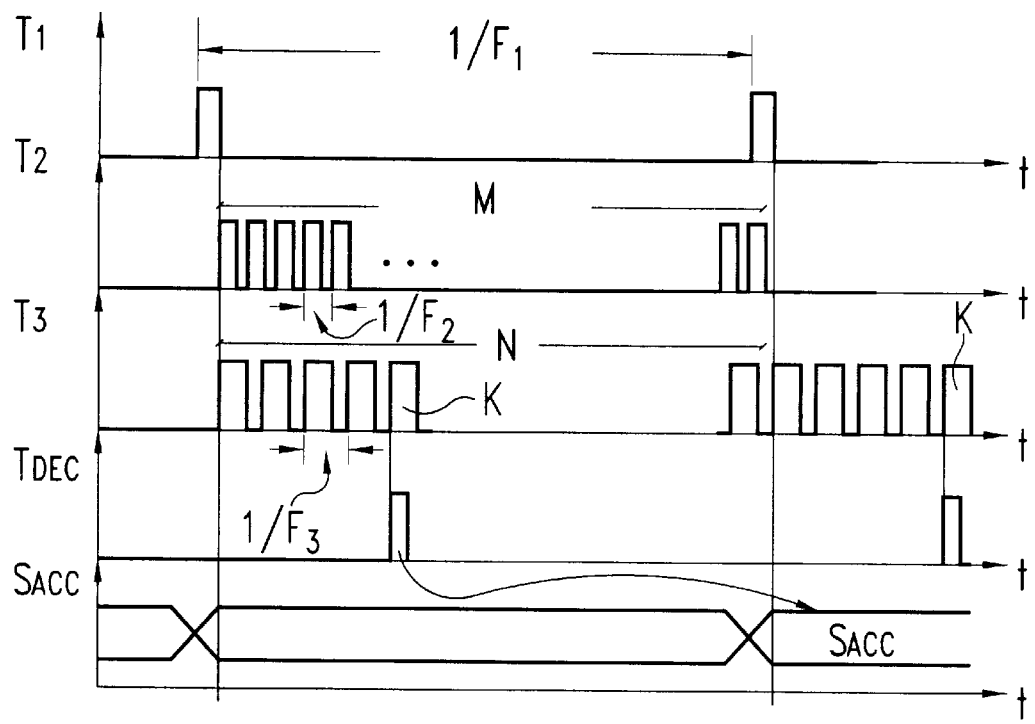
FIG. 5 shows the plot of quantities taken in the device according to the invention.

In a per se known manner, the decimator 38 filters the sampled signal BS received from the A/D converter 37 in order to reconstruct an oversampled numeric signal, wherein every sample includes a preset number of bits, and in order to eliminate any high frequency components introduced by the analog measure signal $V_M$. Indeed, if these component are not eliminated, decimation would cause a spectrum folding that, as known, causes distortions. In addition, at each decimation pulse $T_{DEC}$, the decimator 38 selects and supplies a sample to a data input 39a of the numeric filter 39, while the other samples are eliminated. For example, at each cycle the K-th sample following the rising edge of the first timing signal $T_1$ is selected, as illustrated in FIG. 5, where the delay K is an integer number comprised between 0 and N−1. Since a decimation pulse $T_{DEC}$ is generated at each cycle of the first timing signal $T_1$, the decimator 38 outputs samples that have the same frequency $F_1$ as the first timing signal $T_1$ of the control loop 25.

The numeric filter 39, which is preferably a second order self-regression filter (or infinite impulse response IIR filter) of a known type, filters the data received from the decimator 38 to eliminate the high frequency noise components and carry out a phase equalization in the frequency band of interest (for example, from 0 Hz to 800 Hz). This enables the phase delay introduced by the decimator 38 to be compensated and reduced to the minimum.

The correction block 40 compensates the presence of offsets and the gain losses introduced by the acquisition stage 31 by adding an offset term to the samples received and, respectively, by multiplying the samples by a preset gain factor.

The signal at the output of the correction block 40 is the acceleration signal $S'_{ACC}$, which is stored in the FIFO type output register 41 to be read preferably in an immediately successive cycle of the first timing signal $T_1$. In practice, each sample of the acceleration signal $S_{ACC}$ is representative of the acceleration detected by the sensing element 30 during the cycle that precedes the first timing signal $T_1$ and is made available through the interface 35 to be used by the compensation block 22 from the start of a cycle that immediately follows (as represented by the arrow in FIG. 5). In addition, thanks to the use of the timing signals $T_2$, $T_3$ and the decimation pulses, respectively generated by the PLL 42 and by the phase generator circuit 43 starting from the first timing signal $T_1$, the acceleration signal $S_{ACC}$ has the first frequency $F_1$ and is therefore synchronous with the signals present in the control loop 25 (in particular, it is synchronous with the control signal $S_{CONTR}$).

Figure 6:
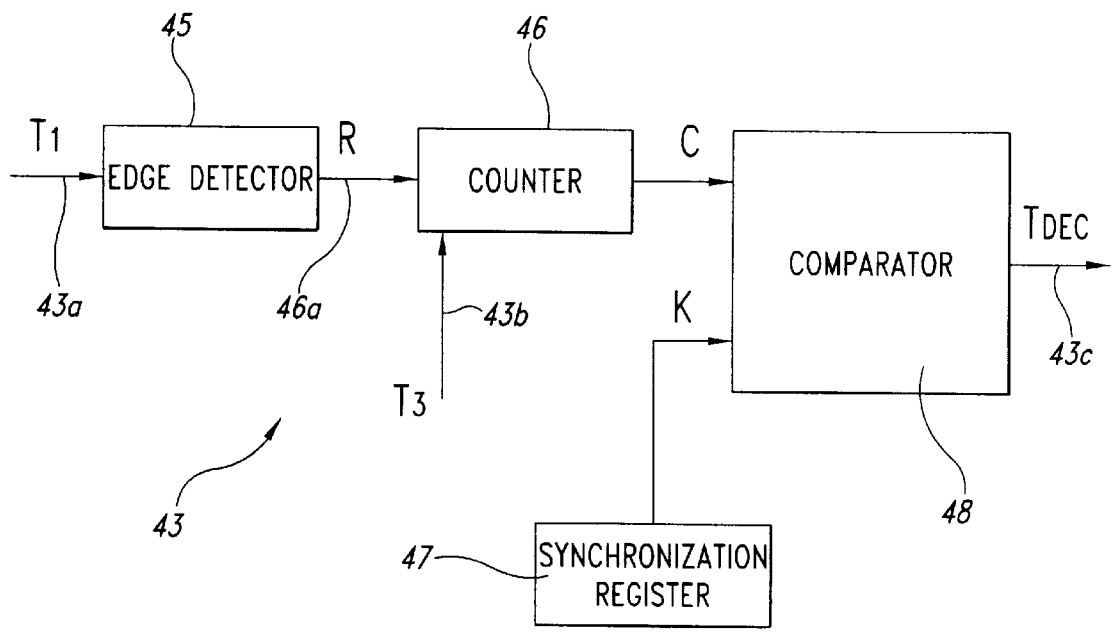
FIG. 6 is a more detailed block diagram of one part of the diagram of FIG. 4.

As shown in FIG. 6, the phase generator circuit 43 comprises an edge detector 45, a counter 46, a synchronization register 47, and a comparator 48.

The edge detector 45 is connected to the first input 43a of the phase generator circuit 43 (fed with the first timing signal $T_1$) and supplies reset pulses R at rising edges of the first timing signal $T_1$. The counter 46 has a reset input 46a receiving the reset pulses R, is connected to the second input 43b of the phase generator circuit 43 (fed with the third timing signal $T_3$) and has an output supplying a counting signal C which is incremented at each cycle of the third timing signal $T_3$ and hence has the third frequency $F_3$.

The comparator 48 has a first input connected to the output of the counter 46, and a second input connected to an output of the synchronization register 42, which supplies the delay K. When the counting signal C is equal to the delay K, an output 43c of the comparator 48 switches, supplying a decimation pulse $T_{DEC}$. Preferably, the delay K is my be programmed by writing the synchronization register 47.

Consequently, the present noise compensating device generates a sampled signal BS having a frequency correlated to the signals present in the control loop 25. Thereby, an acceleration signal $S_{ACC}$ may be generated, which represents accelerations due to disturbance forces acting on the R/W device 1 and is synchronous with the control signal $S_{CONTR}$, without need of sampling frequency conversions. Moreover, the samples of the acceleration signal $S_{ACC}$ may be generated immediately before being used by the compensation block 22. As a consequence, the phase of the compensation signal $S_{COMP}$ is not degraded. Rather, the use of the numeric filter 39 to perform an equalization, enables minimization of the phase delay, and thus ensures a high effectiveness of the open loop noise compensation.

Synchronization is moreover performed using a hardware circuit instead of a firmware procedure. The design phase is thus simplified, and it is possible to reduce both the size of the nonvolatile memory storing the firmware and the required processing power.

In addition, the numeric filter 39 eliminates of any noise outside of the frequency band, and in particular high frequency noise. Furthermore, the fact that the sensor assembly 17 is represented by a single integrated device means that the noise affecting the acceleration signal $S_{ACC}$ is very contained.

Finally, it is clear that numerous variations and modifications may be made to the device described herein, without departing from the scope of the present invention.

In particular, as already emphasized, the invention may be advantageously applied in all cases in which it is necessary to perform high precision open loop compensation in a discrete time control system.

In addition, the numeric filter 39 may be of a programmable type and may be modified at any moment through the interface circuit 35. In this way, it is more versatile and is suitable for creating adaptive control systems. Finally, the sensor element may be of a different type and may comprise, for instance, one or more linear MEMS sensors. In this latter case, the sensors may be oriented along different axes in such a way as to detect different acceleration components. The signals supplied by each sensor may then be combined in a per se known manner for calculating the overall acceleration to which the R/W device 1 is subjected as a result of the disturbance forces.

What is claimed is:

1. A noise compensating device in a discrete time control system, comprising:
    closed loop control means generating a first timing signal, a signal indicative of a quantity to be controlled, and a control signal, which have a control frequency;
    open loop control means generating a compensation signal synchronous with said control signal and supplied to said closed loop control means for correcting said control signal, said open loop control means comprising:
        sensing means generating an analog signal correlated to a disturbance quantity;
        sampling means receiving said analog signal and generating a sampled signal having a sampling frequency correlated to said control frequency; and
        a decimator stage receiving said sampled signal and generating said compensation signal.

2. The device of claim 1 wherein said sampling means have a timing input, and said open loop control means further comprise synchronization means, said synchronization means having a frequency sensing input receiving said first timing signal, and a first output connected to said timing input and generating a second timing signal.

3. The device of claim 2 wherein said synchronizing means comprise:
    frequency generating means receiving said first timing signal and having a first and a second output, said first output being connected to said sampling means and supplying said second timing signal, and said second output being connected to said decimator stage and supplying a third timing signal; and
    phase generating means receiving said first timing signal and said third timing signal, and having an output connected to said decimator stage and supplying synchronization pulses.

4. The device of claim 3 wherein said second timing signal has a timing frequency, and said third timing signal has said sampling frequency, said timing frequency and said sampling frequency being integer multiples of said control frequency; and in that said synchronization pulses have said control frequency and a preset delay which is programmable with respect to said first timing signal.

5. The device of claim 1 wherein said sampling means comprise an analog-to-digital converter of the sigma-delta type.

6. The device of claim 3 wherein said decimator stage comprises a decimator circuit having a timing input connected to said second output of said frequency generating means and receiving said third timing signal, and a decimation input connected to said output of said phase generating means and receiving said synchronization pulses.

7. The device of claim 6 wherein said decimator stage comprises phase equalization means having an input connected to an output of said decimator stage for equalizing said compensation signal with respect to said first timing signal.

8. The device of claim 7 wherein said phase equalization means comprise a self-regressive numeric filter having a timing input connected to said second output of said frequency generating means and receiving said third timing signal, and an activation input connected to said output of said phase generating means and receiving said synchronization pulses.

9. The device of claim 8 wherein said self-regressive numeric filter is programmable.

10. The device of claim 3 wherein said frequency generating means comprise a phase locked loop.

11. The device of claim 3 wherein said phase generating means comprise:
    counter means having a counting input receiving said third timing signal, a reset input and an output supplying a counting signal having said sampling frequency;
    reset means, having an input and an output, said input of said reset means receiving said first timing signal and said output being connected to said reset input of said counter means and supplying reset pulses at preset switching edges of said first timing signal.

12. The device of claim 11 wherein said phase generating means further comprise comparator means and memory means, said memory means having an output supplying a delay; said comparator means having a first input connected to said output of said counter means and receiving said counting signal, a second input connected to an output of said memory means and receiving said delay, and an output supplying said synchronization pulses when said counting signal and said delay are equal.

13. The device of claim 12 wherein said delay is programmable.

14. The device of claim 4 wherein said integer multiples are, respectively, 224 and 32.

15. A noise compensating device in a discrete time control system for a R/W device, comprising:
    a rotatable computer-readable media;
    a R/W head positioned in proximity with the computer readable media to read data stored on the computer-readable media and to write data to the computer-readable media; and
    a R/W device control circuit, comprising:
        a closed loop control circuit to generate a first timing signal, a signal indicative of a quantity to be controlled, and a control signal, which have a control frequency;
        an open loop control circuit to generate a compensation signal synchronous with said control signal and supplied to said closed loop control circuit to correct said control signal, said open loop control circuit comprising:
            a sensing element to generate an analog signal correlated to a disturbance quantity;
            a sampling circuit to receive said analog signal and generating a sampled signal having a sampling frequency correlated to said control frequency; and
            a decimator stage receiving said sampled signal and generating said compensation signal.

16. The R/W device of claim 15 wherein the R/W device is a hard disk and said signal indicative of a quantity to be controlled is a track position signal, and said disturbance quantity is a disturbance acceleration.

17. A method for compensating disturbance in a discrete time control system, comprising:

closed loop controlling a signal indicative of a quantity to be controlled having a control frequency, said closed loop controlling step comprising the step of generating a first timing signal and a control signal, which have said control frequency;

open loop controlling a disturbance quantity, said step of open loop controlling comprising the steps of:

generating an analog signal correlated to said disturbance quantity;

sampling said analog signal at a sampling frequency that is correlated to said control frequency, thereby generating a sampled signal;

decimating said sampled signal, thereby generating a compensation signal synchronous with said control signal; and adapting said control signal according to said compensation signal.

18. The method of claim 17, further comprising:

starting from said first timing signal, generating a second timing signal having a timing frequency, and a third timing signal having said sampling frequency; said timing frequency and said sampling frequency being integer multiples of said control frequency;

starting from said first timing signal and said third timing signal, generating synchronization pulses having said control frequency and a preset delay with respect to said first timing signal; and sampling said analog signal using said second timing signal, and decimating said sampled signal using said third timing signal and said synchronization signal.

19. The method of claim 18 wherein said sampling comprises performing an analog-to-digital conversion, and in that said step of decimating comprises the step of selecting, for each cycle of said first timing signal, a sample having a preset delay with respect to preset switching edges of said first timing signal.

20. The method of claim 19 wherein said performing an analog-to-digital conversion is carried out using a sigma-delta converter timed with said second timing signal.

21. The method of claim 17 wherein said decimating comprises generating a disturbance measure signal and phase equalizing said disturbance measure signal in a preset frequency band.

22. The method of claim 21 wherein said preset frequency band is between 0 Hz and 800 Hz.

23. The method of claim 21 wherein said equalizing comprises filtering said disturbance measure signal using an IIR filter.

24. The method of claim 23, further comprising programming the IIR filter.

* * * * *